(12) United States Patent
Imanaka

(10) Patent No.: US 8,080,875 B2
(45) Date of Patent: Dec. 20, 2011

(54) INTERCONNECTION SUBSTRATE AND SEMICONDUCTOR DEVICE, MANUFACTURING METHOD OF INTERCONNECTION SUBSTRATE

(75) Inventor: Yoshihiko Imanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 172 days.

(21) Appl. No.: 11/968,341

(22) Filed: Jan. 2, 2008

(65) Prior Publication Data

US 2008/0197501 A1 Aug. 21, 2008

(30) Foreign Application Priority Data

Feb. 19, 2007 (JP) ................. 2007-038199

(51) Int. Cl.
*H01L 23/48* (2006.01)
(52) U.S. Cl. ........... 257/758; 257/762; 257/E23.145; 257/E21.585; 438/256
(58) Field of Classification Search ............ 156/247; 257/686, 758–780, E23.011, E23.145, E21.585, 257/E23.001; 523/137; 174/262
See application file for complete search history.

(56) References Cited

U.S. PATENT DOCUMENTS

| 5,746,868 | A | * | 5/1998 | Abe ........................ 156/247 |
| 7,579,251 | B2 | | 8/2009 | Imanaka et al. | |
| 2001/0004944 | A1 | * | 6/2001 | Nakamura et al. ............ 174/262 |
| 2001/0051673 | A1 | * | 12/2001 | Suzuki et al. ................. 523/137 |
| 2002/0050407 | A1 | * | 5/2002 | Sohn et al. .................... 174/262 |
| 2004/0056344 | A1 | * | 3/2004 | Ogawa et al. ................. 257/686 |
| 2004/0212091 | A1 | * | 10/2004 | Asahi et al. ................... 257/758 |

FOREIGN PATENT DOCUMENTS

| JP | 2601128 | B2 | | 4/1997 |
| JP | 2004-339565 | A | | 12/2004 |
| JP | 2004-342831 | A | | 12/2004 |
| JP | 2005-005645 | A | | 1/2005 |
| JP | 2006-147734 | A | | 6/2006 |
| JP | 2006147734 | | * | 6/2006 |

OTHER PUBLICATIONS

Akedo, Jun "Aerosol Deposition of Ceramic Thick Films at Room Temperature: Densification Mechanism of Ceramic Layers", J. Am Ceram. Soc. 89 (6) Jun. 2006, pp. 1834-1839.
"JP Official Action", mailed by JPO and corresponding to Japanese application No. 2007-038199 on Jul. 19, 2011, with partial English translation.

* cited by examiner

*Primary Examiner* — Matthew E Warren
*Assistant Examiner* — Fang-Xing Jiang

(57) ABSTRACT

An interconnection substrate including therein one or more resin layers, each of the resin layers including therein a via-hole penetrating from a top surface to a bottom surface of the resin layer. A via-plug of metal particles is formed in the via-hole. Each of the metal particles has a flattened shape generally parallel to a plane of the resin layer.

9 Claims, 16 Drawing Sheets 14A (14B,14C)

11A (11B,11C)

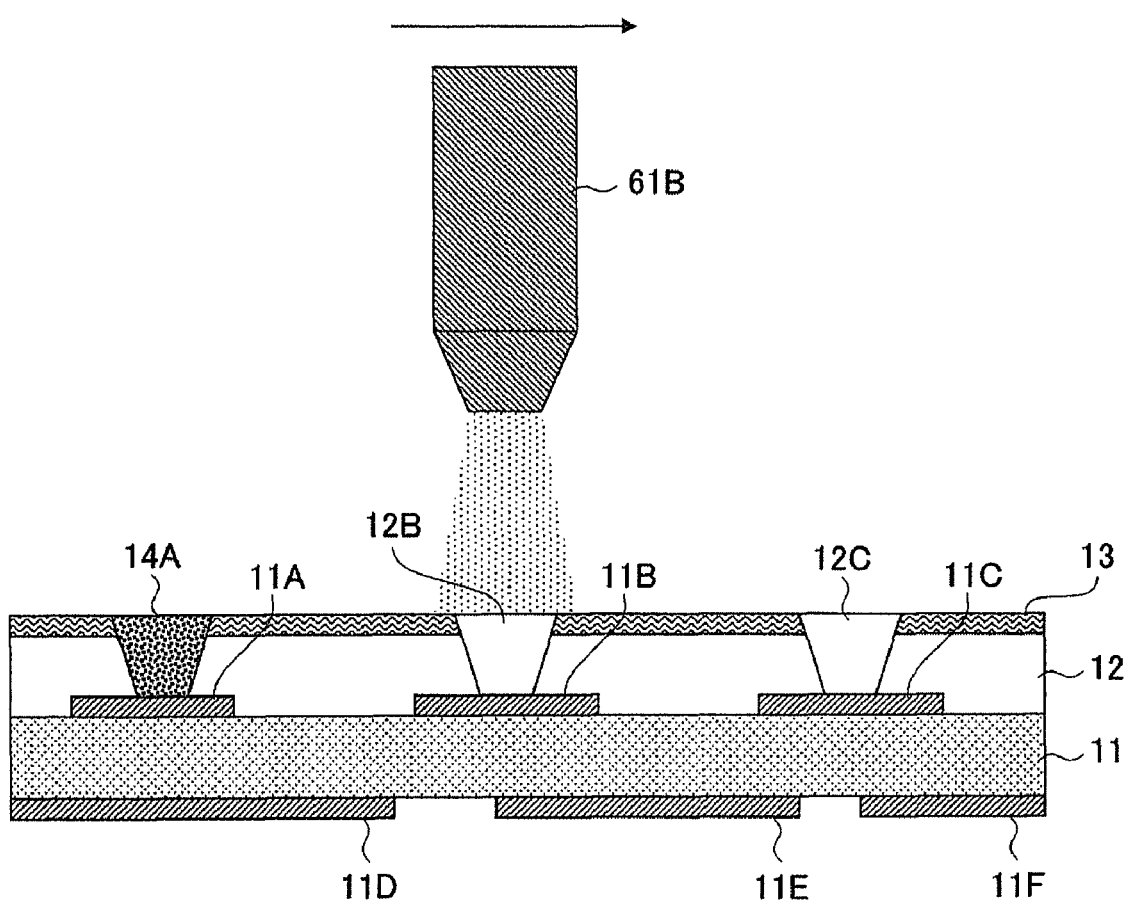

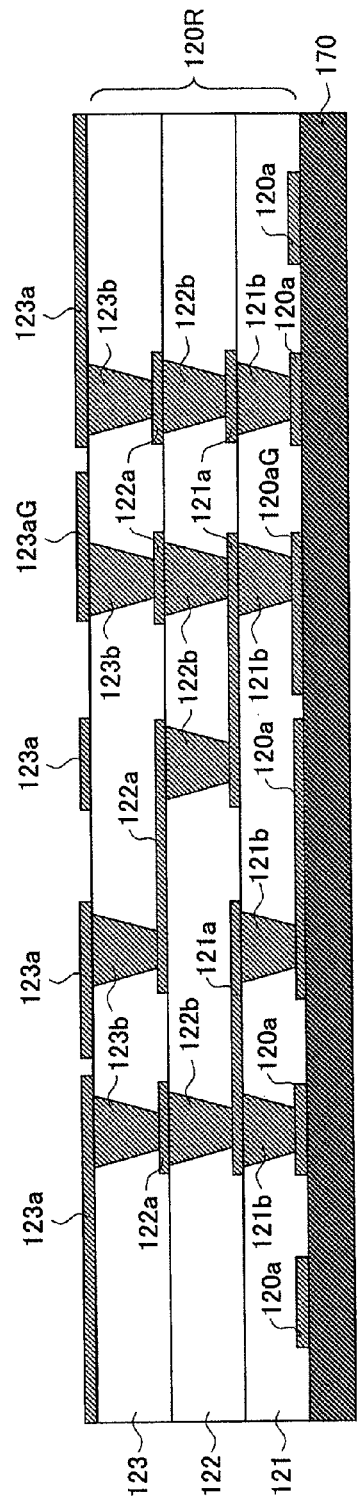
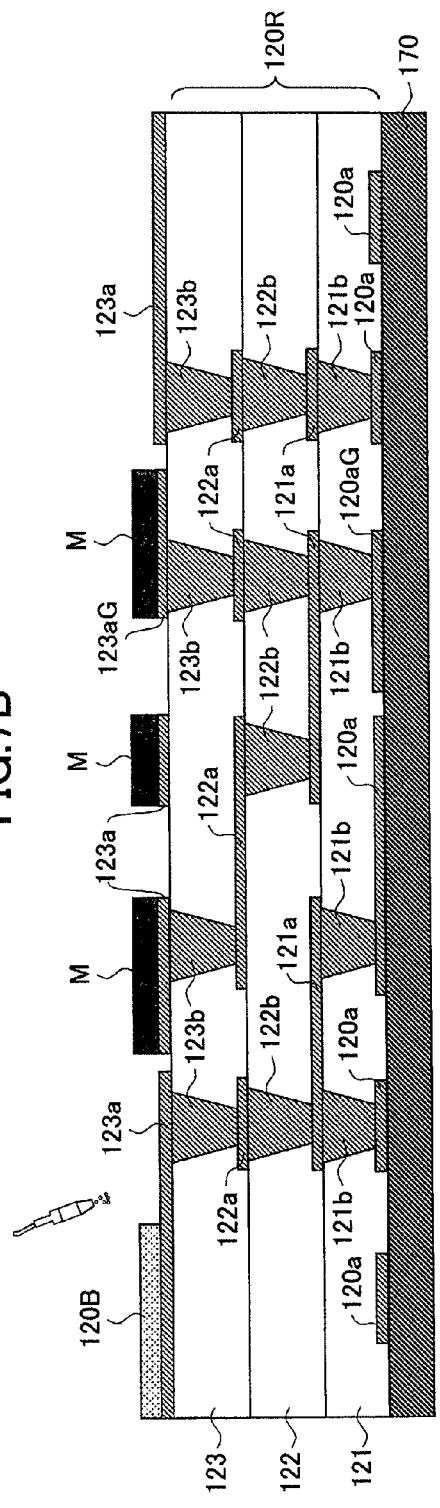

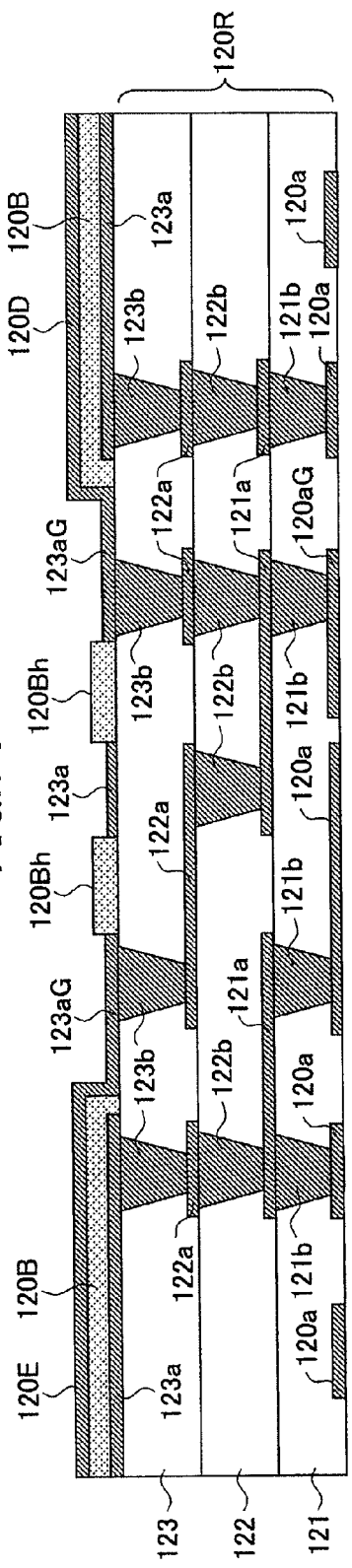
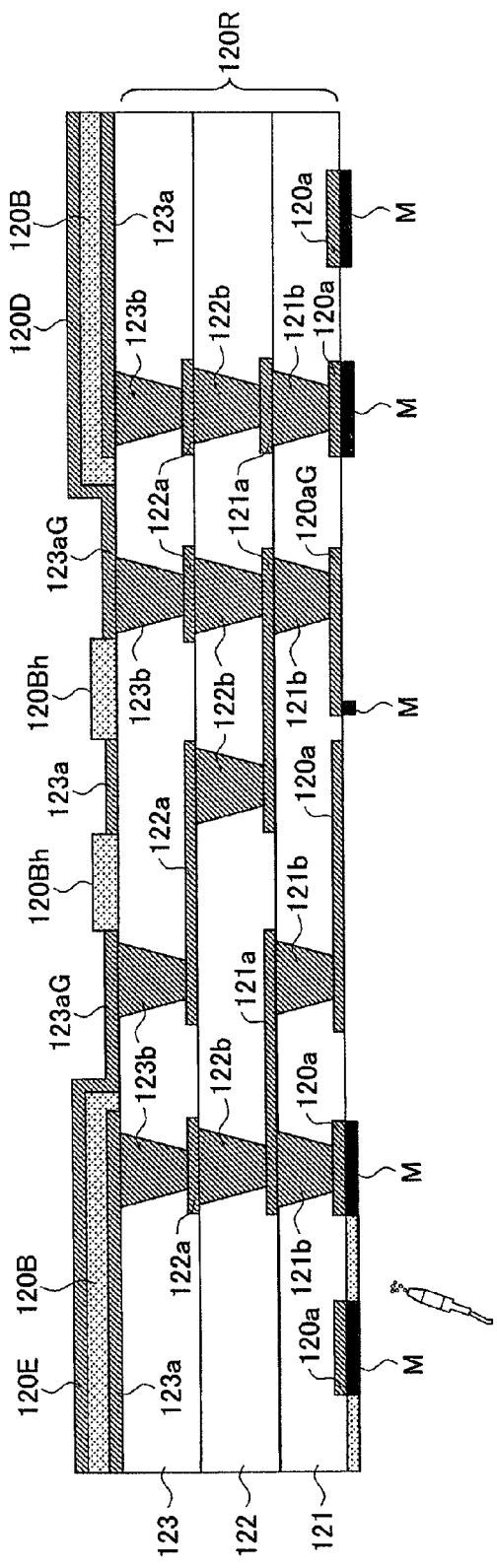

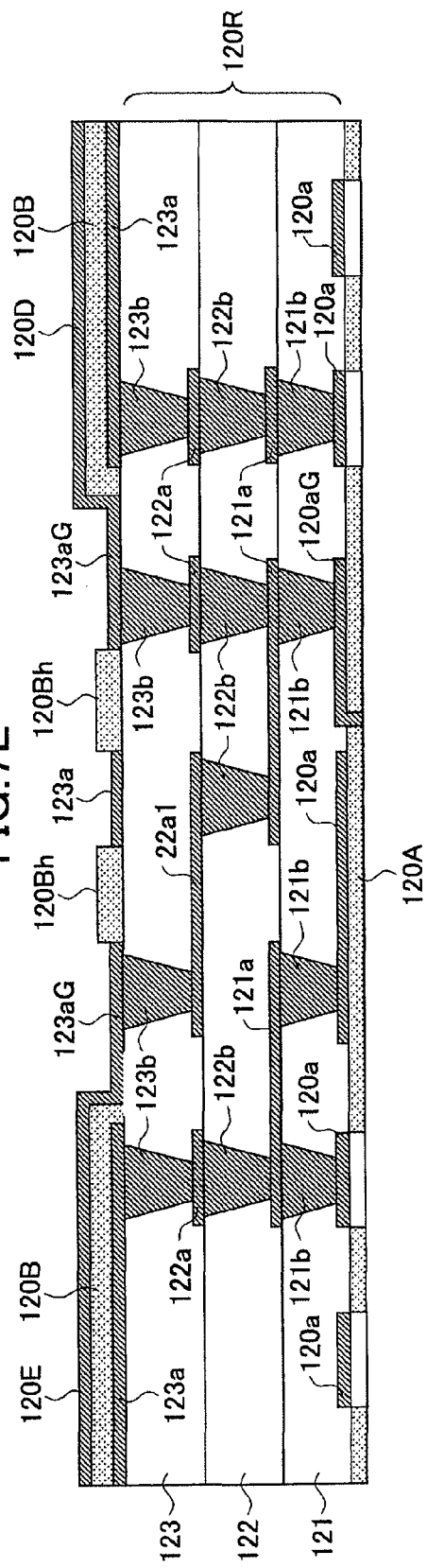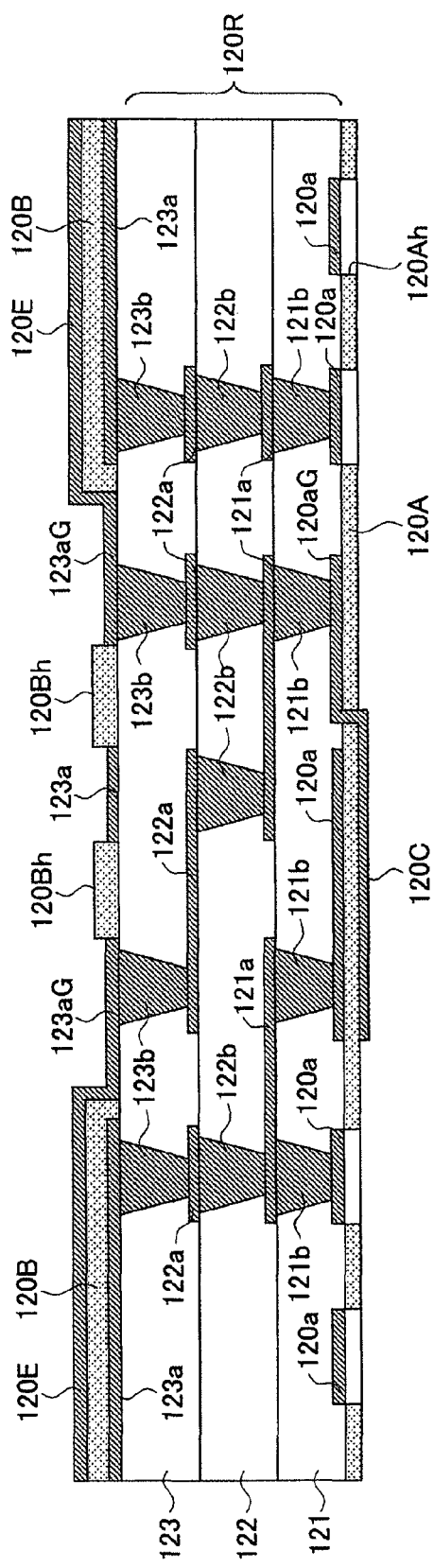

INTERCONNECTION SUBSTRATE AND SEMICONDUCTOR DEVICE, MANUFACTURING METHOD OF INTERCONNECTION SUBSTRATE

CROSS-REFERENCE TO RELATED APPLICATION

The present application is based on Japanese priority application No. 2007-038199 filed on Feb. 19, 2007, the entire contents of which are hereby incorporated by reference.

BACKGROUND OF THE INVENTION

The present invention generally relates to electronic apparatuses and more particularly to a multilayer interconnection substrate and an electronic apparatus that uses such a multilayer interconnection substrate.

In high-performance semiconductor devices or electronic apparatuses of these days, a resin multilayer substrate is used for the mounting substrate carrying a semiconductor chip. Such mounting substrate constitutes the key technology in the art of mounting, and thus, the cost and performance of the mounting substrate provides a profound influence on the entire area of semiconductor devices and electronic apparatuses.

A resin multilayer substrate formed by a buildup process has the advantageous feature of enabling formation of minute interconnection patterns, and thus, buildup process is used extensively for the manufacturing process of mounting substrate of these days. Meanwhile, further reduction of cost and improvement of performance are imposed also upon such resin buildup substrates.

Patent Reference 1 Japanese Patent 2601128

SUMMARY OF THE INVENTION

The present invention is directed to various embodiments of an interconnection substrate including therein one or more resin layers, each including therein a via-hole penetrating from a top surface to a bottom surface of said resin layer, a via-plug of metal particles being formed in said via-hole, wherein each of said metal particles has a flattened shape generally parallel to a plane of said resin layer.

Other objects and further features of the present invention will become apparent from the following detailed description when read in conjunction with the attached drawings.

BRIEF DESCRIPTION OF THE DRAWINGS

FIGS. 2A-2G are diagrams showing a process of manufacturing a multilayer interconnection substrate according to a first embodiment of the present invention;

FIGS. 7A-7F are diagrams explaining the manufacturing process of an optical semiconductor device of FIG. 6.

DETAILED DESCRIPTION OF THE PREFERRED EMBODIMENTS

As described above, in a resin buildup substrate, interconnection between different layers is attained by way of through-holes or via-holes. In the interlayer interconnection attained by via-holes, in particular, it is possible to form a desired interlayer interconnection at an arbitrary in-plane location of the substrate, and thus, it becomes possible to realize high-density interconnection easily with the interlayer interconnection by via-holes.

Conventionally, there is known, from Patent Reference 1, a so-called ALIVH technology as the process for forming a resin buildup substrate having via-holes. In ALIVH technology, via-holes are formed in each of the resin layers constituting the resin buildup substrate by way of laser beam machining, followed by filling the via-holes thus formed with a conductive paste. The resin layers having the via-holes thus filled with the conductive paste are then stacked with each other and applied with heat together with pressure to form the desired multilayer buildup substrate.

On the other hand, with such ALIVH technology, the via-plugs thus formed in the via-holes are formed of conductive resin, and thus, there is a problem that the via-plugs have a high electric resistance. Further, because filling of the conducting resin into the via-holes is achieved by using a printing technology, there is a problem in that it becomes difficult to fill the conductive resin into the via-holes in the case the via-holes have a minute size.

While it is possible to fill the via-holes with a conductor not containing resin for example by using a film forming technology such as a sputtering process or a plating process, the use of sputtering process can provide only a very low throughput and is not practical. In the case of using a plating process, on the other hand, the manufacturing process becomes complex, and there again arises the problem of low throughput and long processing time.

First Embodiment

Figure 1:
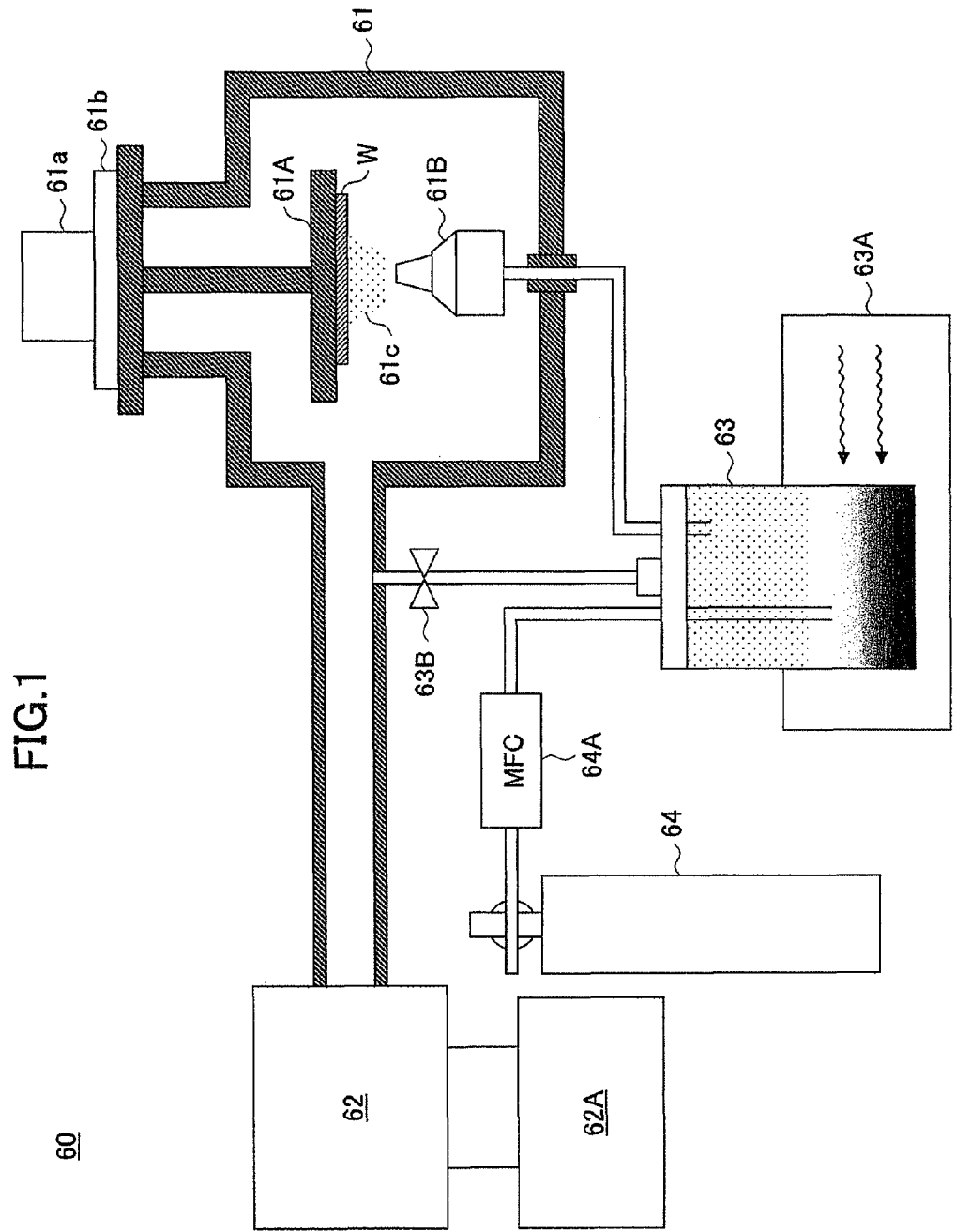
FIG. 1 is a diagram showing the construction of an aerosol deposition apparatus used with the present invention.

FIG. 1 shows the schematic construction of an aerosol deposition apparatus 60 used with the present invention.

Referring to FIG. 1, the aerosol deposition apparatus 60 includes a processing vessel 61 evacuated to vacuum by a mechanical booster pump 62 and a vacuum pump 62A, wherein a substrate W to be processed is held in the processing vessel 61 on a stage 61A in a manner movable in X-Y-Z-θ directions by an X-Y stage driving mechanism 61a and a Z stage driving mechanism 61b.

In the processing vessel 61, there is disposed a nozzle 61B so as to face the substrate W to be processed on the stage 61A, wherein the nozzle 61B is provided with an aerosol of a metal or ceramic material together with a dry carrier gas and sprays the same upon the surface of the substrate W to be processed in the form of a jet 61c. Thus, the jet 61c is free from a liquid such as solvent.

The metal or ceramic particles constituting the aerosol thus sprayed generally have a particle diameter of 10-100,000 nm and cause impact solidification or activation at the surface of the substrate W to be processed. Thereby, there is formed a dense metal film or ceramic film characterized by the deposition of flattened particles as a result of plastic deformation.

In order to supply the aerosol to the nozzle 61B, the aerosol deposition apparatus 60 of FIG. 1 is provided with a source vessel 63 holding a powder source material of metal or ceramic of the particle diameter of preferably 0.5 μm or less, and an inert gas or a high-purity oxygen gas is supplied to the source vessel 63 from a high-pressure gas source 64 as a carrier gas via a mass flow controller 64A. Further, the source vessel 63 is held on a vibrating base 63A for facilitating formation of the aerosol, wherein the water in the source material is removed by the pumps 62 and 62A when the valve 63B is opened in advance of formation of the aerosol.

FIGS. 2A-2G show the manufacturing process of a multi-layer interconnection substrate according to a first embodiment of the present invention.

Figure 2A:
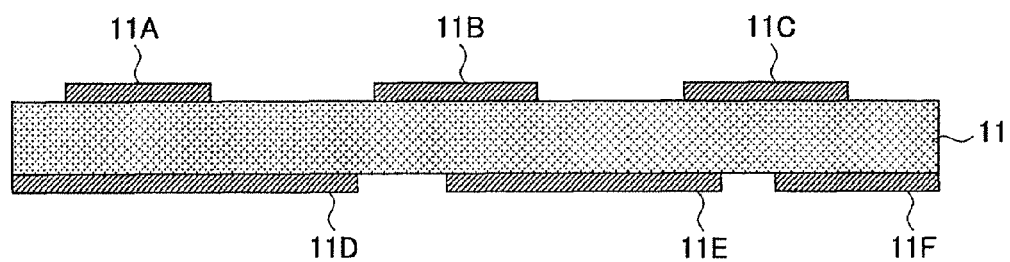
Figure 2B:
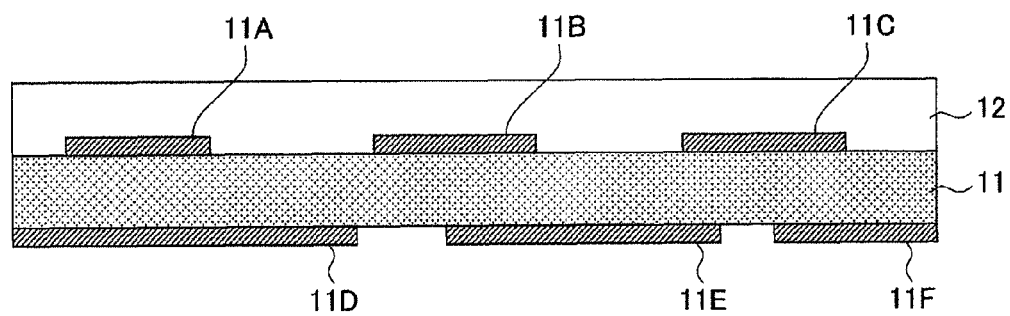

Referring to FIG. 2A, there are formed interconnection patterns 11A-11C and interconnection patterns 11D-11F respectively on a top surface and a bottom surface of a printed circuit board 11 by way of an electrolytic plating process, and a resin prepreg 12 is laid upon the printed circuit board 11 in the step of FIG. 2B. For the resin prepreg 12, it is possible to use a resin sheet of epoxy resin or aramid-epoxy resin having a porosity of 10-60% and a thickness of 5-300 μm.

Figure 2C:
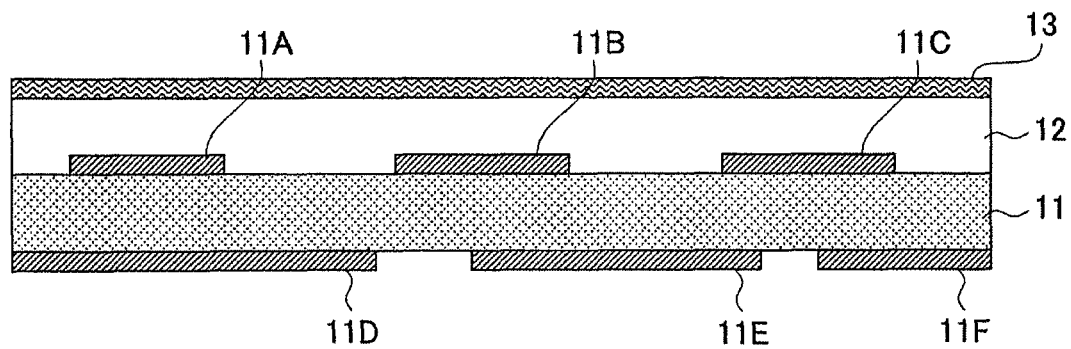
Figure 2D:
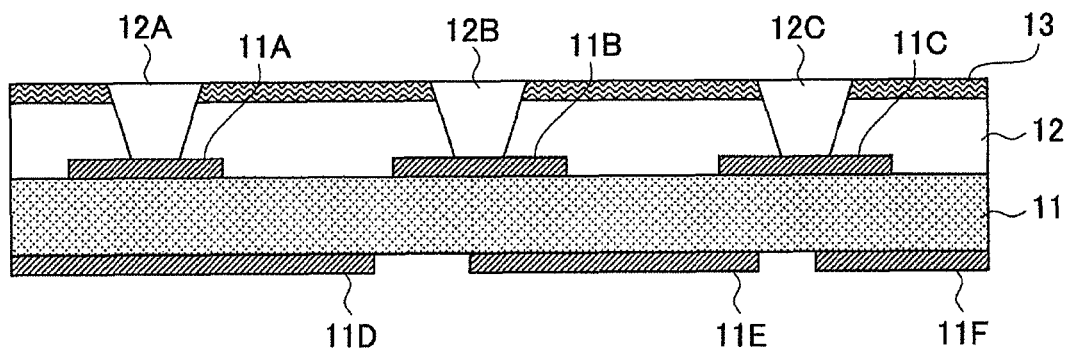

Next, in the step of FIG. 2C, there is formed a protective film 13 of PET (polyethylene terephthalate) or PEN (polyethylene naphthalate) on the prepreg 12, and a laser beam irradiation is made into the prepreg 12 through the protective film 13 in the step of FIG. 2D, and there are formed via-holes 12A-12C in correspondence to the interconnection patterns 11A-11C.

Next, in the step of FIG. 2E, the structure of FIG. 2D is introduced into the processing vessel 61 of the aerosol deposition apparatus 60 of FIG. 1 as the substrate W to be processed, and metal via-plugs 14A-14C of Cu, or the like, are formed in the via-holes 12A-12C.

More specifically, a Cu powder of the average particle diameter of 1.5 μm is accommodated into the source vessel 63 and held at a temperature of 80° C. Further, ultrasonic vibration is applied to the entire vessel 63 by driving the vibrating base 63A, and the valve 63B is opened. At the same time, the vacuum pumps 62 and 63 are activated and water or moisture is removed from the Cu power source material.

Further, while applying the ultrasonic vibration to the source vessel 63 from the vibrating base 63A, a high-purity oxygen gas is introduced into the source vessel 63 from the high-pressure gas source 64 under the pressure of 0.5-8.0 kg/cm$^2$ with a flow rate of 4l/min, preferably under the pressure of 2 kg/cm$^2$ with a flow rate of 1l/min, via the mass flow controller 64A, and with this, there is formed an aerosol of the Cu power. It should be noted that the aerosol thus formed is free from liquid such as water or solvent.

Figure 2F:
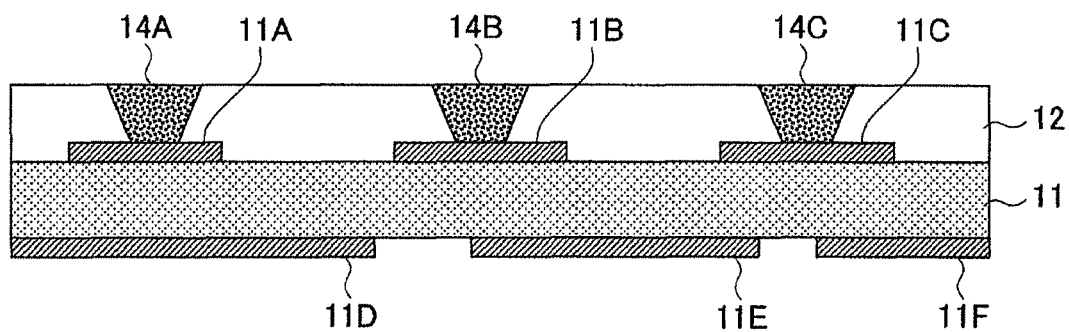

The aerosol of the Cu particles thus formed is ejected upon the substrate W in the processing vessel 61, which is evacuated in advance to the pressure of 10 Pa or less, in the form of an aerosol jet 61c. Thereby, the nozzle 61B is moved as shown in FIG. 2E to scan over the substrate 11, and with this, there are formed Cu via-plugs 14A-14C respectively in the via-holes 12A-12C as shown in FIG. 2F. After start of the film formation, the pressure inside the processing vessel 61 is maintained at 200 Pa.

Figure 3:
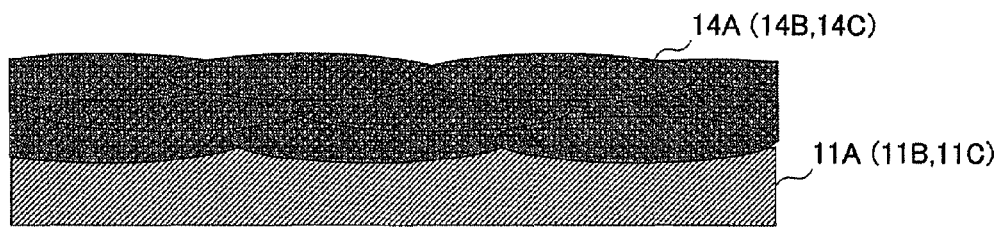
FIG. 3 is a schematic diagram showing the construction of a metal layer obtained by an aerosol deposition process.

FIG. 3 schematically shows a typical microstructure of the Cu via-plug 14A thus formed. It should be noted that similar microstructure exists also in the Cu via-plugs 14B and 14C, wherein the description thereof will omitted.

Referring to FIG. 3, the Cu via-plug 14A is formed of deposition of Cu particles of flat shape generally parallel to the plane of the prepreg 12, thus reflecting the effect of ductile deformation caused with impact activation of the Cu aerosol particles. For example, the Cu particles may have flattened shape and be oriented such that a long axis along the flattened plane of such Cu particles is oriented generally parallel to the prepreg 12. It should be noted that the Cu particles generally have an in-plane particle diameter of 0.1-30 μm and a height of 0.05-10 μm and form together a dense structure free from void.

Formation of such via-holes 14A-14C in the via-holes 12A-12C by the aerosol deposition process can be achieved within the duration of 180 seconds in the case of the substrate of the size of 10 cm×10 cm. Thus, it is possible with the present invention to form the via-plugs 14A-14C with high throughput. Further, it is possible to form the via-plugs easily even when the via-holes 12A-12C have a diameter of 50 μm or less.

It was confirmed that the Cu via-plugs 14A-14C thus formed have a resistivity of 1 μΩcm. It should be noted that this value of resistivity is only about 1.2 times as large as the inherent resistivity of Cu (1.68 μΩcm).

Figure 2G:
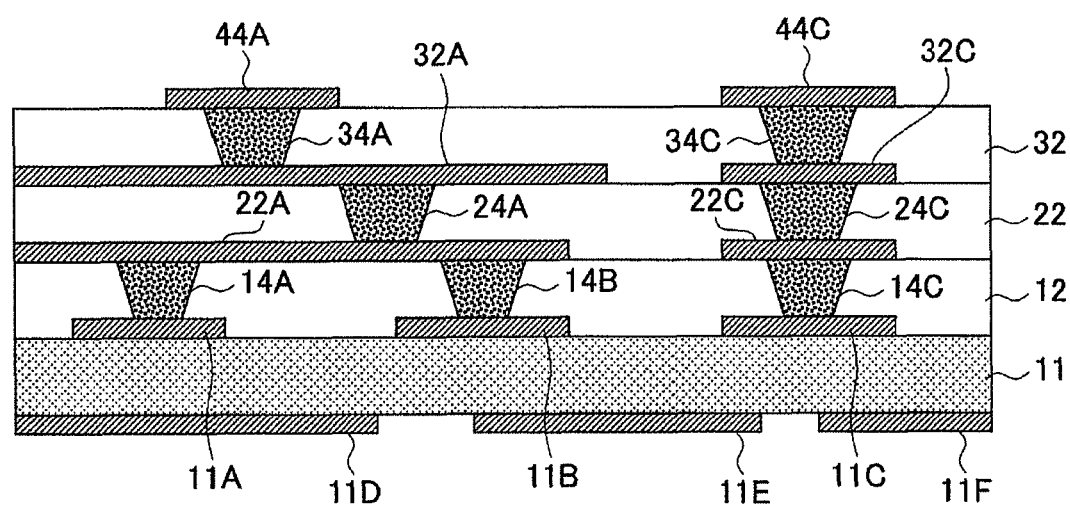

Further, after the step of FIG. 2F, the steps of FIGS. 2A-2E are repeated on the structure of FIG. 2F, and with this, there is obtained a multilayer interconnection substrate on the substrate 11 such that the buildup resin layers 12, 22 and 32 are laminated on the substrate 11 as shown in FIG. 2G, by further applying thereto heat and compression. In the structure of FIG. 2G, it should be noted that Cu via-plugs 24A and 24C are formed in the buildup resin layer 22 together with Cu interconnection patterns 21A and 21C and Cu via-plugs 34A and 34C are formed in the buildup resin layer 32 together with Cu interconnection patterns 32A and 32C. Further, Cu interconnection patterns 44A and 44C are formed on the buildup resin layer 32.

In the present embodiment, it should be noted that the via-plugs formed with the aerosol deposition process is not limited to Cu via-plugs, but the via-plugs may also be formed of metals such as Au, Ag, Pt, Al, and the like, or an alloy containing one or more of these metal elements.

While the foregoing explanation has been made for the case of forming via-holes in each resin prepreg by using aerosol deposition process, it is obvious that it is possible to form a through via-hole by using a plurality of such via-holes.

Second Embodiment

FIGS. 4A-4H show the manufacturing process of a multi-layer interconnection substrate according to a second embodiment of the present invention.

Figure 4A:
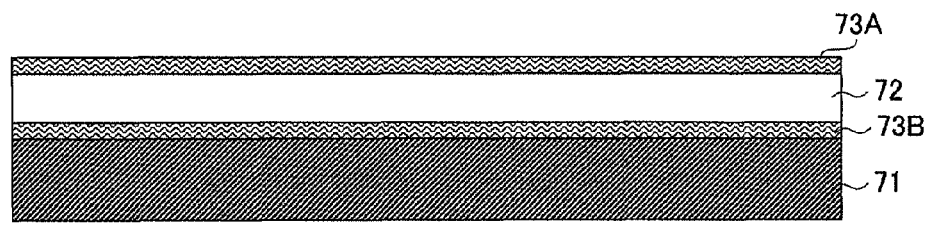
FIGS. 4A-4H are diagrams showing a process of manufacturing a multilayer interconnection substrate according to a second embodiment of the present invention.

Referring to FIG. 4A, there is formed a resin prepreg 72 similar to the resin prepreg 12 of the previous embodiment on a base 71 of Cu, Si, Al, or the like, in the form sandwiched by protective films 73A and 73B of PET (polyethylene terephthalate) or PEN (polyethylene naphthalate) similar to the protective film 13.

Figure 4B:
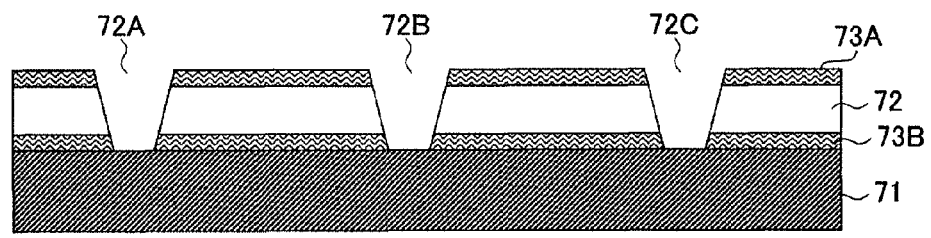

Next, in the step of FIG. 4B, there is applied a laser beam irradiation into the prepreg 72 via the protective film 73A, and predetermined via-holes 72A-72C are formed in the prepreg 72.

Figure 4C:
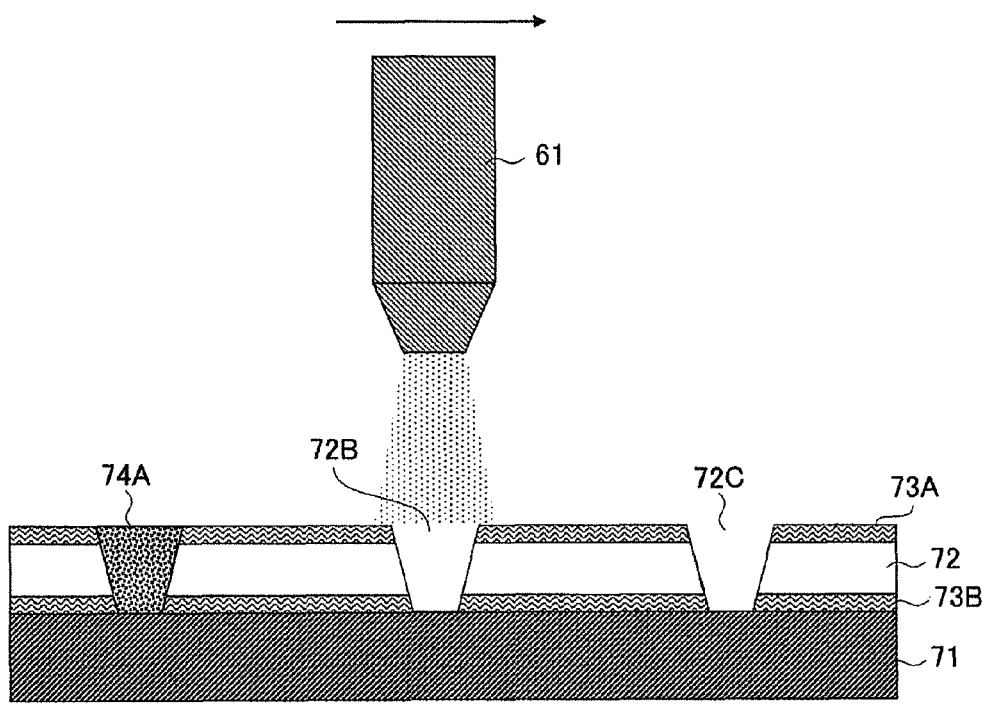
Figure 4D:
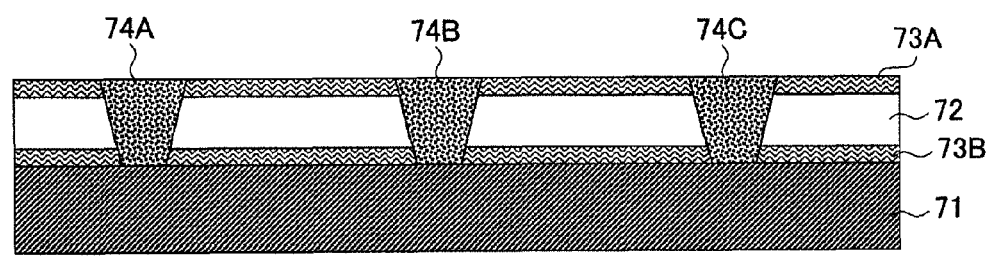

Next, in the step of FIG. 4C, the structure of FIG. 4B is introduced into the processing vessel 61 of the aerosol deposition apparatus 60 of FIG. 1 as the substrate W to be processed, and metal via-plugs 74A-74C of Cu, or the like, are formed in the via-holes 12A-12C similarly to the process of FIG. 2E. With this, the structure shown in FIG. 4D is obtained. It was confirmed that the Cu via-plugs 74A-74C thus formed have a resistivity of 1.9 μΩcm.

Figure 4E:
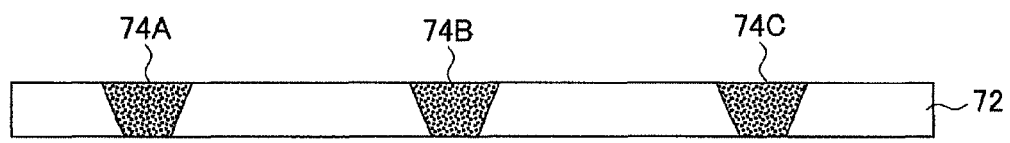

Further, in the step of FIG. 4E, the protective films 73A and 73B are removed from the resin prepreg 72, and with this, the resin prepreg 72 is separated from the underlying base 71.

Figure 4F:
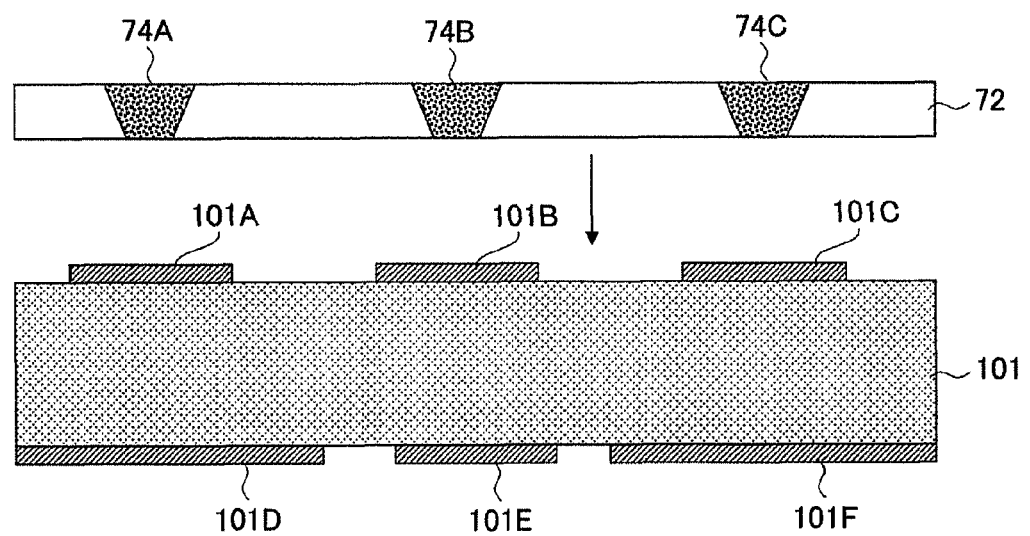

Further, the prepreg 72 thus separated is laminated, in a step of FIG. 4F, upon a printed circuit board 101, which carries Cu interconnection patterns 101A-101C on a top surface and Cu interconnection patterns 101D-101F on a bottom surface. With this, the structure shown in FIG. 4G is obtained.

Figure 4G:
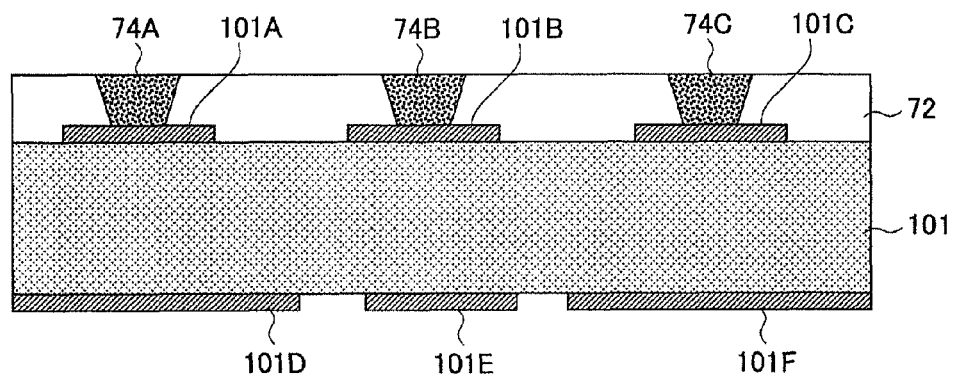
Figure 4H:
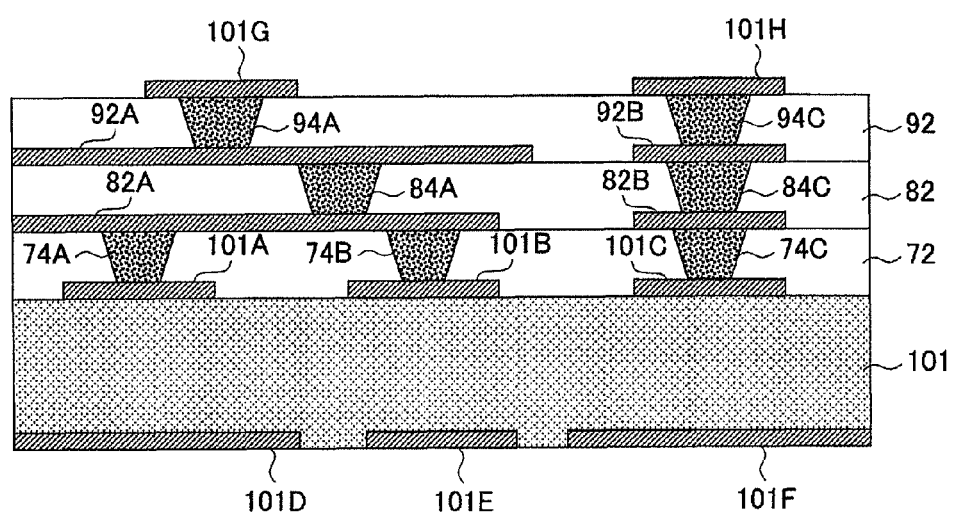

Further, by forming Cu interconnection patterns 82A and 82C on the structure of FIG. 4G and by laminating a prepreg 82 similar to the prepreg of FIG. 4E thereon, and by further laminating a next prepreg 92 likewise, a multilayer interconnection substrate shown in FIG. 4H is obtained. In the structure of FIG. 4H, it should be noted that Cu via-plugs 84A and 84C are formed in the buildup resin layer 82 together with Cu interconnection patterns 82A and 82C, while Cu via-plugs 94A and 94C are formed in the buildup resin layer 92 together with Cu interconnection patterns 92A and 92C. Further, Cu interconnection via-plugs 101G and 1010H are formed on the buildup resin layer 92.

Table 1 below compares the resistivity of the via-plugs and the time needed for the formation of the via-plugs for the case of forming the Cu via-plugs in the via-holes in a single layer of the prepreg of the first and second embodiments with regard to the state in which the Cu interconnection patterns are formed further thereon, in comparison with: the case of forming the same via-plugs and the Cu interconnection patterns by way of filling a conductive paste and pasting of Cu foil (Comparative Example 1); forming the same via-plugs by way of filling the conductive paste and forming the same Cu interconnection patterns by an electroless plating process and electrolytic plating process (Comparative Example 2); and forming same via-plugs and the Cu interconnection patterns entirely by the electroless plating process and electrolytic plating process. Here, it should be noted that the duration of via-plug formation is represented by a relative value normalized to the case of Comparative Example 1.

TABLE 1

|  | Comparative example 1 | Comparative example 2 | Comparative example 3 |
|---|---|---|---|
| Copper via resistivity ($\mu\Omega \cdot cm$) | 3.5 | 3 | 2 |
| Via-formation process time (relative value) | 1 | 2 | 5 |

|  | Embodiment 1 | Embodiment 2 |
|---|---|---|
| Copper via resistivity ($\mu\Omega \cdot cm$) | 2 | 1.9 |
| Via-formation process time (relative value) | 1.5 | 1.5 |

Referring to Table 1, it can be seen that a resistivity of 3 or 3.5 $\mu\Omega$m is attained for the case in which the Cu via-plugs are formed by filling the conductive resin, while in the case of the first and second embodiments of the present invention, the resistivity of 2 $\mu\Omega$m or less is attained.

Further, in the case of conducting the formation of the Cu via-plugs by way of electroless and electrolytic plating process, it takes a duration of five times as large as the case of the comparative example 1 for the formation of the via-holes and the interconnection patterns, while in the case of the process of the first and second embodiments of the present invention, a duration of 1.5 times is sufficient for the formation of the via-holes and the interconnection patterns.

Thus, according to the present invention, it becomes possible to manufacture a multilayer interconnection substrate of low resistance via-holes with relatively short processing time.

Third Embodiment

FIGS. 5A-5G show the manufacturing process of a multilayer interconnection substrate according to a third embodiment of the present invention. In the drawings, those parts explained before are designated by the same reference numerals and the description thereof will be omitted.

Figure 5A:
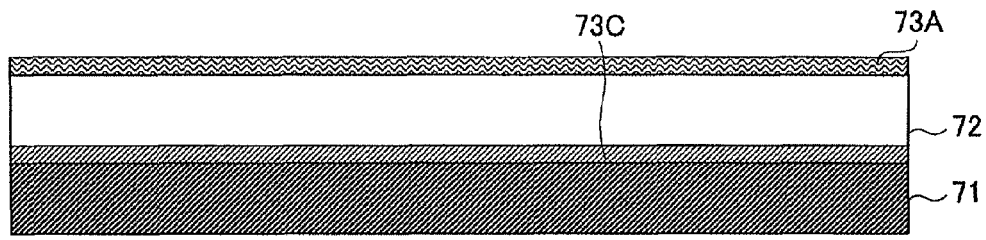
FIGS. 5A-5G are diagrams showing a process of manufacturing a multilayer interconnection substrate according to a third embodiment of the present invention.

Referring to FIG. 5A, there is laid a resin prepreg 72 on the base 71 via a Cu foil 73C, and a protective film 73A is formed on the resin prepreg 72.

Figure 5B:
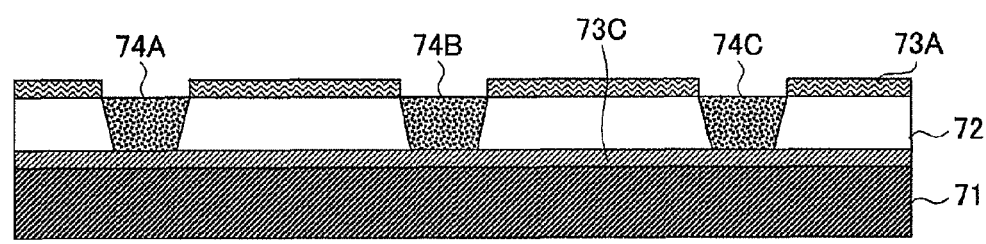

Next, in the step of FIG. 5B, via-holes are formed in the resin prepreg 72 by a laser beam machining process similarly to the process of FIG. 4B, and the Cu via-plugs 74A-74C are formed in the via-holes thus formed with the aerosol deposition process.

Figure 5C:
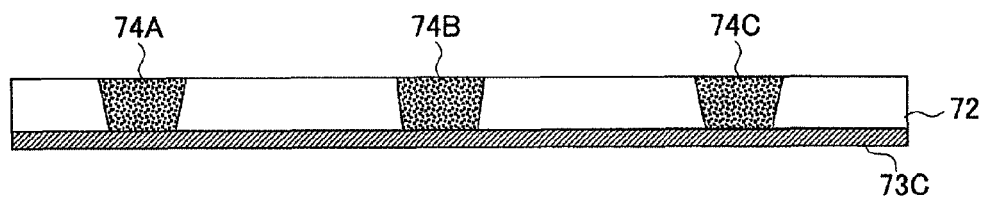
Figure 5D:
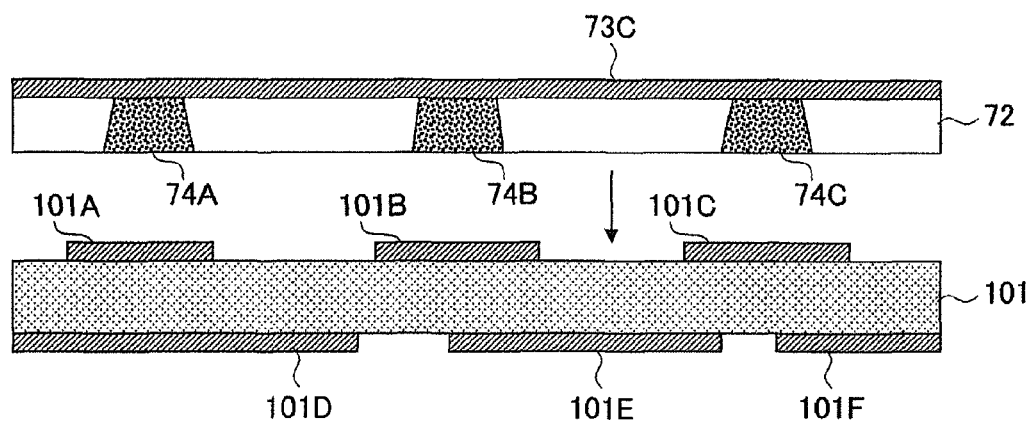
Figure 5E:
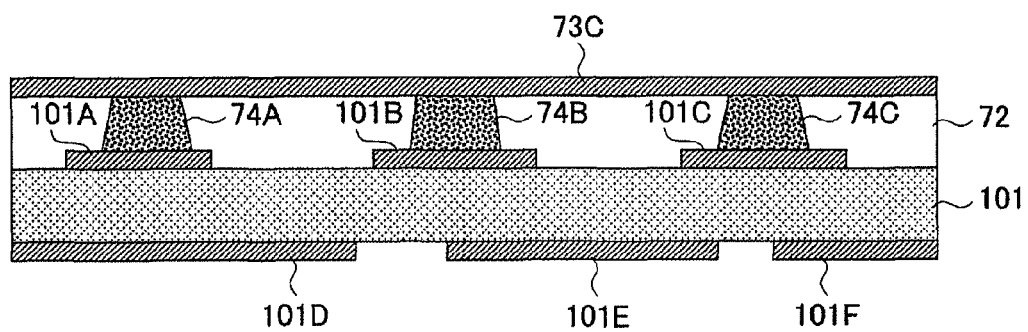

Further, in the step of FIG. 5C, the base 71 is separated and the protective film 73A is removed, and the resin prepreg 72 carrying the Cu foil 83C on the bottom surface as shown in FIG. 5C is laid upon the printed circuit board 101 carrying thereon the Cu interconnection patterns 101A-101F in an upside down state in the step of FIG. 5D to form a structure shown in FIG. 5E.

Figure 5F:
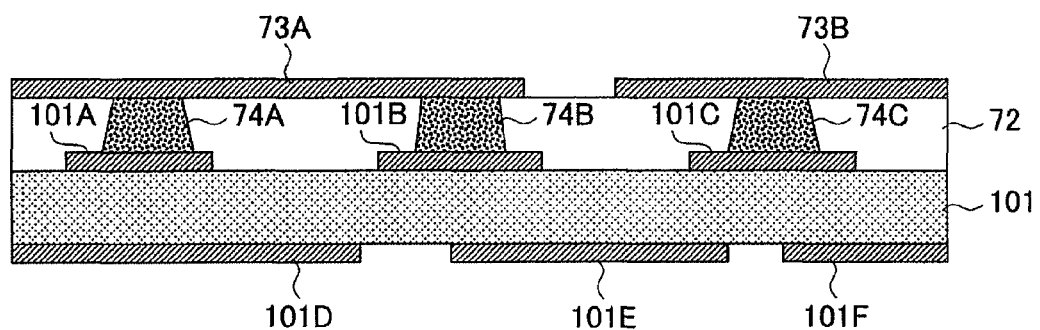

Further, in the step of FIG. 5F, the Cu foil 73C is patterned by a resist process to form Cu interconnection patterns 73A and 73B, and similar resin prepregs 82 and 92 are further laid thereon consecutively by a similar process.

Figure 5G:
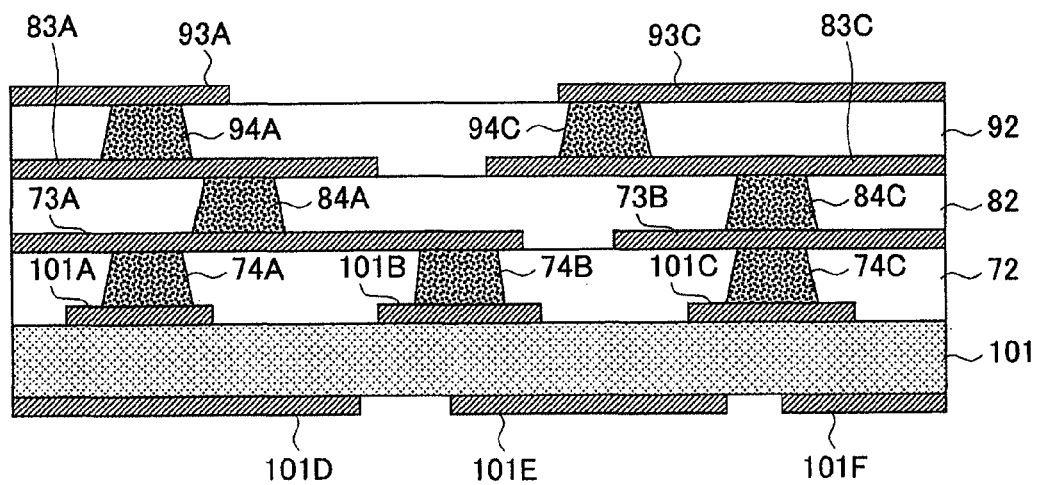

In the structure of FIG. 5G, it will be noted that the Cu interconnection patterns 83A and 83B are formed on the top surface of the resin prepreg 82 by the patterning of a Cu film similarly to the step of FIG. 5F, and the Cu interconnection patterns 93A and 93C are formed on the top surface of the resin prepreg 92 by the patterning of a Cu film similarly to the step of FIG. 5F.

Fourth Embodiment

Figure 6:
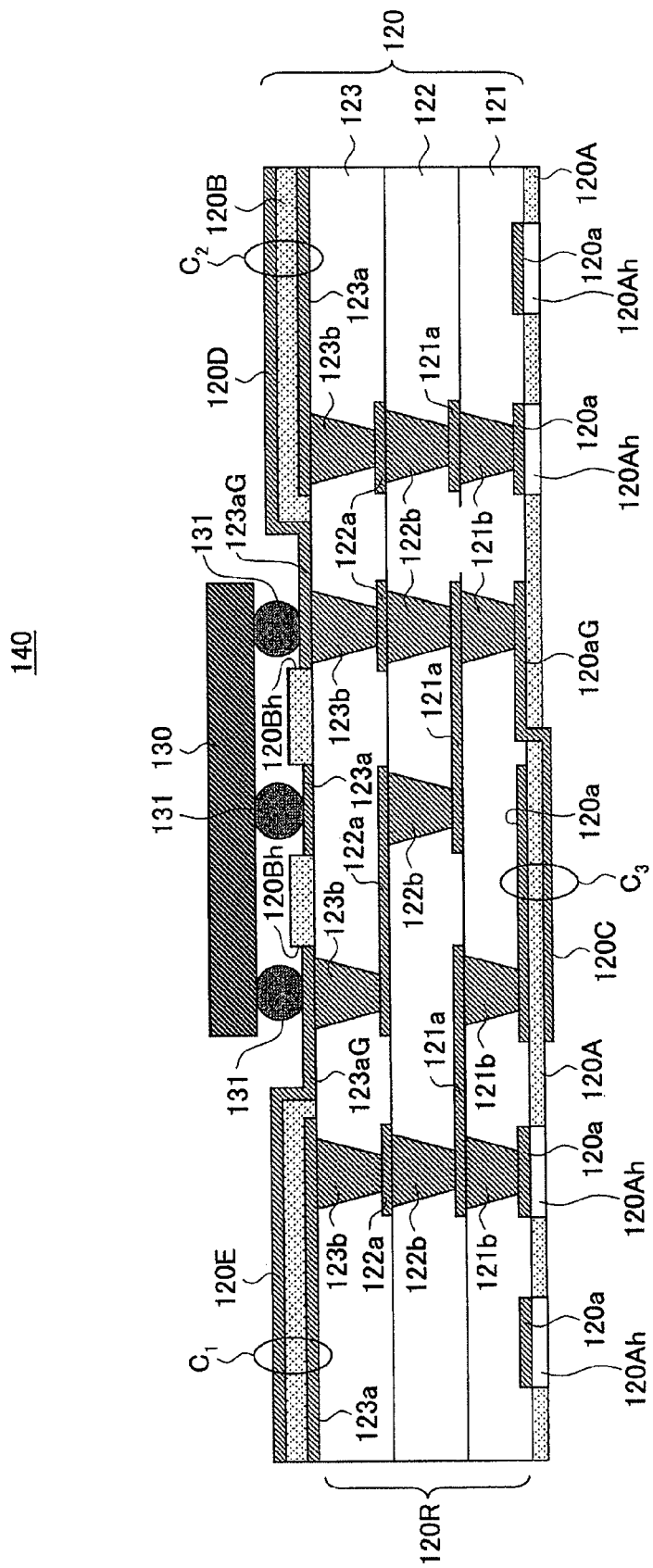
FIG. 6 is a diagram showing the construction of a semiconductor device according to a fourth embodiment of the present invention.

FIG. 6 is a diagram showing the construction of a semiconductor device according to a fourth embodiment of the present invention.

Referring to FIG. 6, the semiconductor device 140 is formed of a coreless multilayer interconnection substrate 120 and a semiconductor chip 130 flip-chip mounted upon the coreless multilayer interconnection substrate 120, wherein the coreless multilayer interconnection substrate 120 is formed of a resin layered body 120R in which buildup insulation films 121, 122 and 123 are laminated.

Here, it should be noted that the buildup insulation film 121 carries Cu interconnection patterns 120a on a bottom surface thereon and Cu interconnection patterns 121a on a top surface thereof, and there are formed Cu via-plugs 121b by an aerosol deposition process explained with reference to the previous embodiment for connecting the Cu interconnection patterns 121a and the Cu interconnection patterns 120a electrically.

Here, it should be noted that the buildup insulation film 122 carries the Cu interconnection patterns 121a on a bottom surface thereof and Cu interconnection patterns 122a on a top surface thereof, and there are formed Cu via-plugs 122b by an aerosol deposition process explained with reference to the previous embodiment for connecting the Cu interconnection patterns 122a and the Cu interconnection patterns 121a electrically.

Further, the buildup insulation film 123 carries the Cu interconnection patterns 122a on a bottom surface thereon and Cu interconnection patterns 123a on a top surface thereof, and there are formed Cu via-plugs 123b by an aerosol deposition process explained with reference to the previous embodiment for connecting the Cu interconnection patterns 123a and the Cu interconnection patterns 122a electrically.

In the illustrated example, the Cu via-plugs 121b, 122b and 123b have a diameter of 40 μm, while the Cu interconnection patterns 121a, 122a and 123a form a 30 μm/30 μm line and space pattern.

With the semiconductor device 140 of the present embodiment, the resin layered body 120R carries, on a bottom surface thereof, a ceramic layer 120A having an elastic modulus of 100-200 GPa, such as 150 GPa, for example, and a thickness of 10-50 μm, and a similar ceramic layer 120B on a top surface thereof, and thus, the resin layered body 120R is reinforced for the entire surface thereof from above and below in spite of the fact that the resin laminated body 120R lacks a core layer. Thus, the coreless multilayer interconnection substrate 120 exhibits excellent mechanical strength and hence excellent elastic modulus in spite of the fact that each of the buildup layers has an elastic modulus of the order of merely 2-20 GPa.

It should be noted that the ceramic layer 120A is formed with an opening 120Ah exposing a part of the Cu interconnection patterns 120a, wherein the Cu interconnection pattern 120a thus exposed by the opening 120Ah forms a pad electrode. Similarly, the ceramic layer 120B is formed with an opening 120Vg exposing a part of the Cu interconnection patterns 123a, wherein the Cu interconnection pattern 123a thus exposed by the opening 123Ah forms a pad electrode.

Here, any material used ordinarily for the high elastic material can be used for the foregoing ceramic layers 120A and 120B. For example, it is possible to use alumina, zirconia, aluminum nitride, cordierite, mullite, titania, quartz, forsterite, wollastonite, anorthite, enstatite, diopside, akermanite, gehlenite, spinel, garnet, and the like, or a titanate such as magnesium titanate, calcium titanate, strontium titanate, barium titanate, and the like. Particularly, from the viewpoint of insulation and strength, it is preferable to use alumina, zirconia, aluminum nitride, cordierite, mullite, and the like.

Further, such ceramic layers 120A and 120B can perform the function of conventional resist film such as elimination of solder birding, reduction of solder pickup amount, elimination of solder pot contamination, protection of substrate at the time of assembling, prevention of oxidation or corrosion of the copper interconnection patterns, prevention of electromigration, and the like.

Further, with the semiconductor device of FIG. 6, the semiconductor chip 130 is flip-chip mounted upon the coreless multilayer interconnection substrate 120 and the pad electrode (not shown) on the semiconductor chip 130 is jointed to the pad electrode 123a exposed at the opening 120Bh formed in the ceramic layer 120B via a bump electrode 131. Further, there is formed an under fill resin layer 132 between the coreless multilayer substrate 120 and the semiconductor chip 130.

Further, with the semiconductor device 140 of FIG. 6, an electrode 120C is formed on the ceramic layer 120A at the bottom surface of the resin layered body 120R in electric connection with a part of the interconnection patterns 120a (interconnection pattern 120aG) that constitutes a ground pattern on the buildup layer 121, wherein the electrode 120C forms a ceramic capacitor $C_3$ together with the ceramic layer 120A and the electrode pattern 120a thereon.

Similarly, with the semiconductor device 140 of foregoing FIG. 6, electrodes 120D and 120E are formed on the ceramic layer 120B on the resin layered body 120R in electric connection with a part of the interconnection patterns 123a (interconnection pattern 123aG) that constitutes a ground pattern on the buildup layer 123, wherein the electrode 120D forms a ceramic capacitor $C_2$ together with the ceramic layer 120B and the electrode pattern 123a underneath thereof. Further, the electrode 120E forms a ceramic capacitor C1 together with the ceramic layer 120B and another electrode pattern 123a underneath thereof.

For example, it is possible to realize the capacitance of about 0.13 nF for the capacitors $C_1$, $C_2$ and $C_3$, provided that alumina having the specific dielectric constant of 10 is used for the ceramic layers 120A and 120B and when the electrode 120C, 120D or 120E has the effective area of 0.0015 m$^2$ and the ceramic layers 120A and 120B have a thickness of 10 μm.

With the semiconductor device 40 of FIG. 6, the via-plugs 121b, 122b and 123b are formed by using the aerosol deposition apparatus 60 of FIG. 1 as explained before, wherein it should be noted that the formation of the ceramic layers 120A and 120B upon the resin layered body 120R is attained also by a similar aerosol deposition process, except that ceramic particles are used in place of the metal particles.

Referring to FIG. 7A, there are formed Cu interconnection patterns 120a on the base 170 of Cu or a Cu alloy, and the first layer buildup insulation film 121 is formed by a vacuum lamination process so as to cover the Cu interconnection patterns 120a. For example, it is possible to use a resin insulation film marketed from Tomoegawa Co, Ltd under the product name TLF-30 for the buildup insulation film 121.

Further, via-holes are formed in the buildup insulation film 121 by a $CO_2$ laser in correspondence to the via-plugs 121b, and Cu via-plugs 21b are formed in the via-holed by the aerosol deposition process while using a resist film (not shown) marketed from Hitachi Chemical Company Limited under the product name Photec as a mask.

Further, a new resist film is formed on the buildup insulation film 121, followed by patterning the same according to a desired interconnection pattern. Further, by carrying out an electrolytic plating process while using the resist pattern thus formed as a mask, the interconnection patterns 121a are formed.

Further, a similar process is repeated, and the resin layered body 120R explained with reference to FIG. 6 is formed on the base 170.

Next, in the step of FIG. 7B, the regions of the resin layered body 120R, on which formation of the electrode pads is to be made, is covered with a screen mask M such as a metal mask, and the ceramic layer 120B is formed in the aerosol deposition apparatus 60 of FIG. 1. With this, there is obtained a structure shown in FIG. 7C in which the parts of the interconnection patterns 123a constituting the pad electrode are exposed from the openings 120Bh formed in the ceramic layer 120B.

In the step of FIG. 7C, it should be noted that there are formed electrodes 120D and 120E on the ceramic layer 120B in connection with a ground pattern 123aG on the buildup layer 123. Further, with the step of FIG. 7C, the Cu base 170 is removed by a wet etching process.

Next, in the step of FIG. 7D, a similar mask pattern M is formed at the bottom surface of the buildup insulation film 121 in correspondence to the predetermined regions for formation of the electrode pads, and a ceramic layer 120A is formed in the aerosol deposition apparatus 60 of FIG. 1 so as to cover the bottom surface of the buildup layer 121.

Further, the mask pattern M is removed in the step of FIG. 7E, and there is obtained a structure such that the parts of the interconnection patterns 120*a* constituting the pad electrodes are exposed via the openings 120Ah formed in the ceramic layer 120A.

Next, in the step of FIG. 7F, a Cu electrode 120C is formed on the ceramic layer 120Ac in connection with a Cu ground pattern 120*a*G formed at the bottom surface of the buildup layer 121, and with this, the coreless multilayer interconnection substrate 120 is obtained.

Further, by flip-chip mounting the semiconductor chip 130 upon the coreless multilayer interconnection substrate 120 of FIG. 7F, the semiconductor device 140 explained previously with reference to FIG. 6 is obtained.

As already explained, it should be noted that the via-plugs formed with the aerosol deposition process is not limited to Cu via-plugs also in the present embodiment, and the via-plugs may also be formed of metals such as Au, Ag, Pt, Al, and the like, or an alloy containing one or more of these metal elements.

According to the above embodiment, it becomes possible, as a result of forming the via-plug into the resin prepreg constituting the interconnection substrate by carrying out the aerosol deposition process of the metal particles, to obtain the desired high-performance interconnection substrate carrying thereon a minute interconnection pattern at a temperature lower than an allowable temperature limit of the resin constituting the resin prepreg with low cost and high efficiency, even in the case the via-plug is a miniaturized via-plug.

While the present invention has been explained for preferred embodiments, the present invention is not limited to such specific embodiments and various variations and modifications may be made within the scope of the invention described in patent claims.

What is claimed is:

1. An interconnection substrate including therein one or more resin layers,
   each of said resin layers including therein a via-hole penetrating from a top surface to a bottom surface of said resin layer,
   a via-plug of metal particles being formed in said via-hole by aerosol deposition process,
   wherein each of said metal particles has undergone ductile deformation and has a flattened shape and is oriented such that a long axis along to a flattened plane of said metal particles is oriented generally parallel to said resin layer.

2. The interconnection substrate as claimed in claim 1, wherein said metal particles have a particle diameter in the range of 10 - 100,000 nm.

3. The interconnection substrate as claimed in claim 1, wherein said metal particles comprise an alloy of Au, Ag, Cu, Pt and Al or an alloy containing these elements.

4. The interconnection substrate as claimed in claim 2, wherein said metal particles comprise an alloy of Au, Ag, Cu, Pt and Al or an alloy containing these elements.

5. The interconnection substrate as claimed in claim 1, wherein each of said resin layers carries an interconnection pattern electrically connected to said via-plug on a top surface and/or bottom surface of said resin layer.

6. The interconnection substrate as claimed in claim 2, wherein each of said resin layers carries an interconnection pattern electrically connected to said via-plug on a top surface and/or bottom surface of said resin layer.

7. The interconnection substrate as claimed in claim 3, wherein each of said resin layers carries an interconnection pattern electrically connected to said via-plug on a top surface and/or bottom surface of said resin layer.

8. The interconnection substrate as claimed in claim 4, wherein each of said resin layers carries an interconnection pattern electrically connected to said via-plug on a top surface and/or bottom surface of said resin layer.

9. A semiconductor device comprising:
   an interconnection substrate; and
   a semiconductor chip mounted upon said interconnection substrate,
   said interconnection substrate including therein one or more resin layers each including therein a via-hole penetrating from a top surface to a bottom surface of said resin layer,
   a via-plug of metal particles being formed in said via-hole by aerosol deposition process,
   wherein each of said metal particles has undergone ductile deformation and has a generally flattened shape and is oriented such that a long axis along to a flattened plane of said metal particles is oriented generally parallel to said resin layer.

* * * * *